(12) United States Patent
Higashi et al.

(10) Patent No.: US 10,074,667 B1
(45) Date of Patent: Sep. 11, 2018

(54) SEMICONDUCTOR MEMORY DEVICE

(71) Applicant: Toshiba Memory Corporation, Tokyo (JP)

(72) Inventors: Kazuyuki Higashi, Yokohama Kanagawa (JP); Kazumichi Tsumura, Shinagawa Tokyo (JP); Ryota Katsumata, Yokkaichi Mie (JP); Fumitaka Arai, Yokkaichi Mie (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/688,561

(22) Filed: Aug. 28, 2017

(30) Foreign Application Priority Data

Mar. 10, 2017 (JP) .................................. 2017-046395

(51) Int. Cl.
*H01L 27/1157* (2017.01)
*H01L 27/11582* (2017.01)
*H01L 27/11556* (2017.01)
(Continued)

(52) U.S. Cl.
CPC ...... *H01L 27/11582* (2013.01); *H01L 23/528* (2013.01); *H01L 25/0657* (2013.01); *H01L 25/50* (2013.01); *H01L 27/11521* (2013.01); *H01L 27/11526* (2013.01); *H01L 27/11551* (2013.01); *H01L 27/11553* (2013.01); *H01L 27/11556* (2013.01); *H01L 27/11563* (2013.01); *H01L 27/11565* (2013.01); *H01L 27/11568* (2013.01); *H01L 27/11573* (2013.01); *H01L 27/11575* (2013.01); *H01L 27/11578* (2013.01); *H01L 29/7926* (2013.01); *H01L 29/7883* (2013.01); *H01L 2225/06541* (2013.01); *H01L 2225/06565* (2013.01)

(58) Field of Classification Search
None
See application file for complete search history.

(56) References Cited

U.S. PATENT DOCUMENTS 7,557,439 B1 7/2009 Sasaki et al.
8,536,670 B2 9/2013 Yoshihara et al.
(Continued)

FOREIGN PATENT DOCUMENTS

JP 2010087502 A 4/2010
JP 2011204829 A 10/2011
(Continued)

*Primary Examiner* — Minh-Loan Tran
(74) *Attorney, Agent, or Firm* — Patterson & Sheridan, LLP

(57) ABSTRACT

A semiconductor memory device includes a first memory cell array layer includes a first memory cell array region, in which memory cells are 3-dimensionally arrayed, and a first and second surface wiring layer connected to the memory cells. A second memory cell array layer includes second memory cell array region, in which memory cells are 3-dimensionally arrayed, and a third and fourth surface wiring layer connected to the second plurality of memory cells. The first memory cell array layer and the second memory cell array layer are bonded to each other such that the second surface wiring layer and the third surface wiring layer face each other and are bonded to each other. The first and second memory cell array regions overlap each other as viewed from a direction orthogonal to a layer plane.

20 Claims, 11 Drawing Sheets

(51) Int. Cl.
*H01L 23/528* (2006.01)
*H01L 27/11521* (2017.01)
*H01L 27/11526* (2017.01)
*H01L 27/11568* (2017.01)
*H01L 25/065* (2006.01)
*H01L 25/00* (2006.01)
*H01L 27/11573* (2017.01)
*H01L 27/11575* (2017.01)
*H01L 27/11578* (2017.01)
*H01L 29/792* (2006.01)
*H01L 27/11553* (2017.01)
*H01L 27/11563* (2017.01)
*H01L 27/11551* (2017.01)
*H01L 27/11565* (2017.01)
*H01L 29/788* (2006.01)

(56) References Cited

U.S. PATENT DOCUMENTS

| | | | |
|---|---|---|---|
| 9,558,945 | B2 | 1/2017 | Fukuzumi et al. |
| 9,691,782 | B1* | 6/2017 | Hwang ............. H01L 27/11565 |
| 2015/0263011 | A1* | 9/2015 | Hong ................ H01L 27/11582 |
| | | | 257/329 |
| 2017/0294443 | A1* | 10/2017 | Kim ................. H01L 27/11565 |
| 2017/0317096 | A1* | 11/2017 | Shin ................. H01L 27/11575 |

FOREIGN PATENT DOCUMENTS

| | | |
|---|---|---|
| JP | 2012054450 A | 3/2012 |
| JP | 2016062801 A | 4/2016 |
| JP | 2016062901 A | 4/2016 |

\* cited by examiner

SEMICONDUCTOR MEMORY DEVICE

CROSS-REFERENCE TO RELATED APPLICATION

This application is based upon and claims the benefit of priority from Japanese Patent Application No. 2017-046395, filed Mar. 10, 2017, the entire contents of which are incorporated herein by reference.

FIELD

Embodiments described herein relate generally to a semiconductor memory device.

BACKGROUND

Semiconductor memory devices having 3-dimensional structures in which holes are formed in stacked bodies including a plurality of electrode layers are stacked on a substrate with insulating layers interposed therebetween and silicon channel bodies are formed inside the holes on charge storage films. There are also proposed technologies for forming control circuits for memory cell arrays having these 3-dimensional structures directly under or directly above these memory cell arrays.

However, in existing examples, memory densities per unit area are not sufficiently improved.

DETAILED DESCRIPTION

Figure 1:
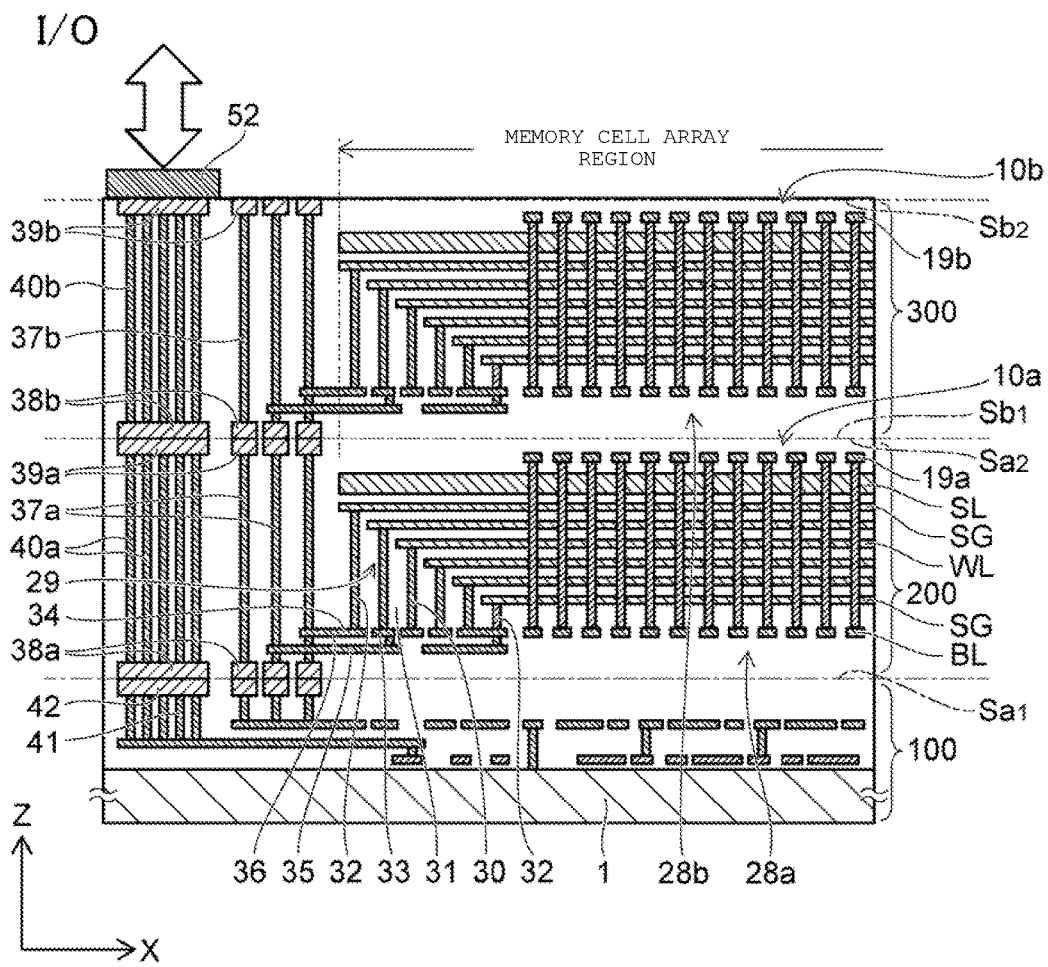
FIG. 1 is a schematic cross-sectional view illustrating a semiconductor memory device according to a first embodiment.

In general, according to one embodiment, a semiconductor memory device, comprises: a first memory cell array layer having a first surface, a second surface opposite to the first surface, a first memory cell array region in which a first plurality of memory cells is 3-dimensionally arrayed, a first surface wiring layer at the first surface, and a second wiring at the second surface, each of the first and second wiring layers being connected to the first plurality of memory cells; and a second memory cell array layer having a third surface, a fourth surface opposite the third surface, a second memory cell array region in which a second plurality of memory cells is 3-dimensionally arrayed, a third surface wiring layer at the third surface, and a fourth surface wiring layer at the fourth surface, each of the third and fourth wiring layers being connected to the second plurality of memory cells. The first memory cell array layer and the second memory cell array layer are bonded to each other such that the second surface wiring layer and the third surface wiring layer face each other and are bonded to each other. Also, the first and second memory cell array regions overlap each other as viewed from a direction orthogonal to the first surface.

Hereinafter, example embodiments will be described with reference to the drawings. The same reference numerals are given to the same elements in the drawings.

First Embodiment

FIG. 1 is a schematic cross-sectional view illustrating a semiconductor memory device according to a first embodiment. The semiconductor memory device according to the first embodiment has a structure in which a peripheral circuit layer 100, including a control circuit that controls writing, erasing, and reading data from memory cells, and a first memory cell array layer 200, including a plurality of first memory cells arranged 3-dimensionally, are bonded together facing each other. The semiconductor memory device has a structure in which the first memory cell array layer 200 and a second memory cell array layer 300, including a plurality of second memory cells arranged 3-dimensionally, are stacked and bonded to face each other.

Figure 2:
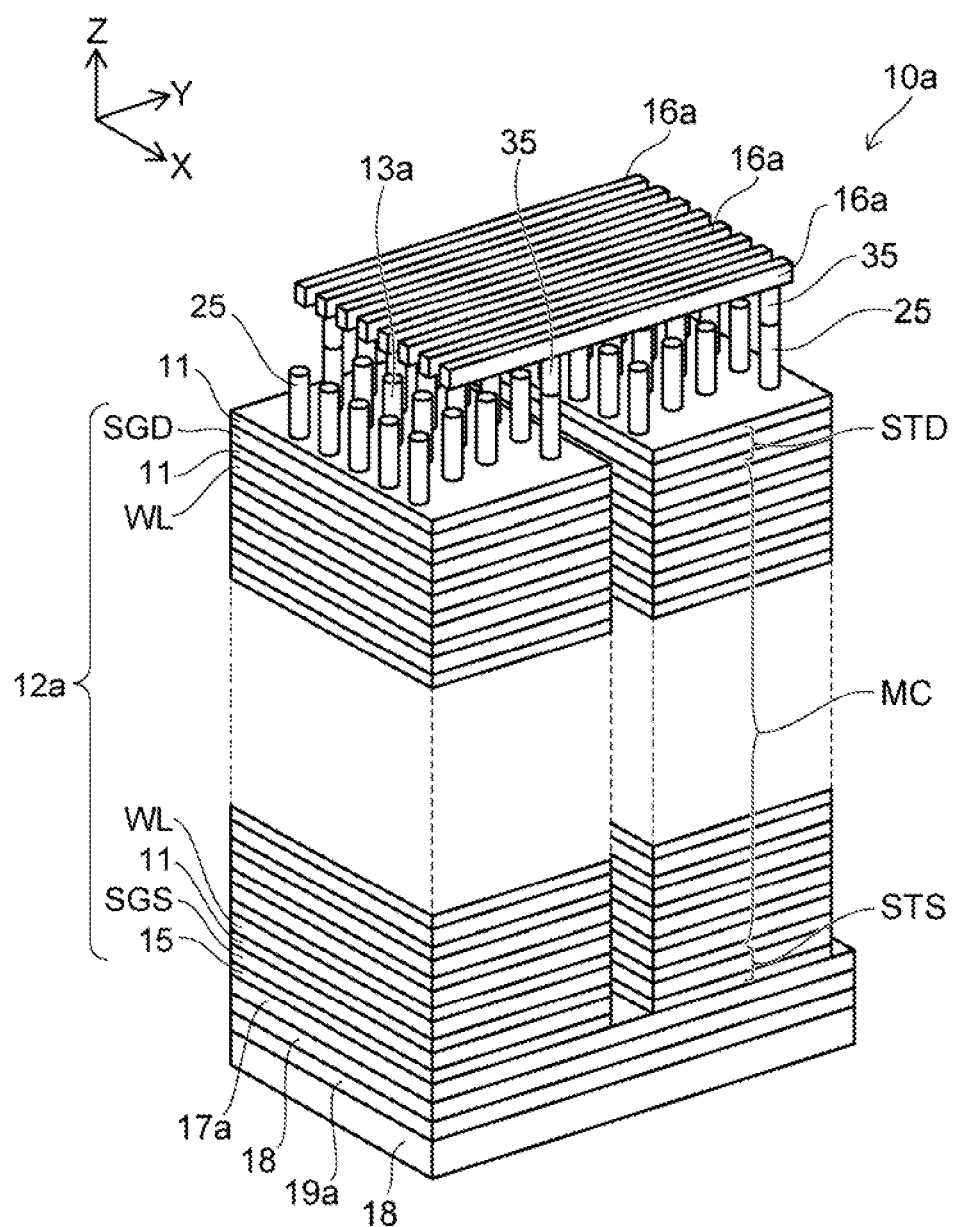
FIG. 2 is a schematic perspective view illustrating the semiconductor memory device according to the first embodiment.

First, the first memory cell array layer 200 will be described. The first memory cell array layer 200 includes a first surface Sa1 and a second surface Sa2 opposite to the first surface in FIG. 1 and includes a first memory cell array 10a having a 3-dimensional structure. FIG. 2 is a schematic perspective view illustrating the semiconductor memory device according to the first embodiment and illustrating the first memory cell array 10a. In FIG. 2, some insulating layers, such as inter-electrode insulating layers, are not specifically illustrated. As depicted in FIG. 2, the upper and lower sides depicted in FIG. 1 are reversed on the page, and thus the upper page side is the first surface side and the lower page side is the second surface side in FIG. 2.

In FIG. 2, the X and Y directions are orthogonal to each other and a direction which is orthogonal to the X and Y directions (XY plane) and in which a plurality of electrode layers WL are stacked is the Z direction, also referred to as a stacking direction.

The first memory cell array 10a includes a first stacked body 12a in which electrode layers WL and insulating layers 11 are alternately stacked on each other. A plurality of first columnar portions 13a extending in the Z direction are formed inside the first stacked body 12a. The first columnar portions 13a are formed in, for example, a cylindrical shape or an elliptic cylindrical shape. For example, the plurality of first columnar portions 13a is arranged in a staggered pattern or a square grid pattern on the XY plane. The electrode layers WL are separated into a plurality of blocks in the Y direction and extend in the X direction.

Each electrode layer WL is a layer that contains, for example, silicon as a main component. Further, the electrode layers WL may contain boron as a dopant to provide for conductivity in the silicon. The electrode layer WL may also contain a metal silicide.

The insulating layer 11 contains, for example, silicon and oxygen and is formed of a silicon oxide film (SiO), a silicon oxynitride film (SiON), or a carbon-containing silicon oxide film (SiOC).

A drain-side selection gate SGD is formed in upper portions of the first columnar portions 13a on the side of the first surface Sa1 and a source-side selection gate SGS is formed in lower portions of the first columnar portions 13a on the side of the second surface Sa2. The drain-side selection gate SGD is formed on the uppermost electrode layer WL with the insulating layer 11 interposed therebetween. The source-side selection gate SGS is formed below the lowermost electrode layer WL with the insulating layer 11 interposed therebetween. Here, for example, the drain-side selection gate SGD and the source-side selection gate SGS can be formed to be thicker than the electrode layer WL of one layer.

First bit lines 16a are connected to upper ends of the first columnar portions 13a on the side of the first surface Sa1. The plurality of first bit lines 16a are formed of a metal. The first bit lines 16a are separated in the X direction to extend in the Y direction. The first bit lines 16a are formed on the drain-side selection gate SGD with the insulating layer 11 and an interlayer insulating layer 14 interposed therebetween.

A first source line 17a is connected to lower ends of the first columnar portions 13a on the side of the second surface Sa2. The first source line 17a is formed below the source-side selection gate SGS with an interlayer insulating layer 15 interposed therebetween. A first source-side wiring layer 19a is formed inside an interlayer insulating layer 18 at the lower ends of the first columnar portions 13a and further below the first source line 17a. The interlayer insulating layer 18 may be a stacked layer.

Figure 3:
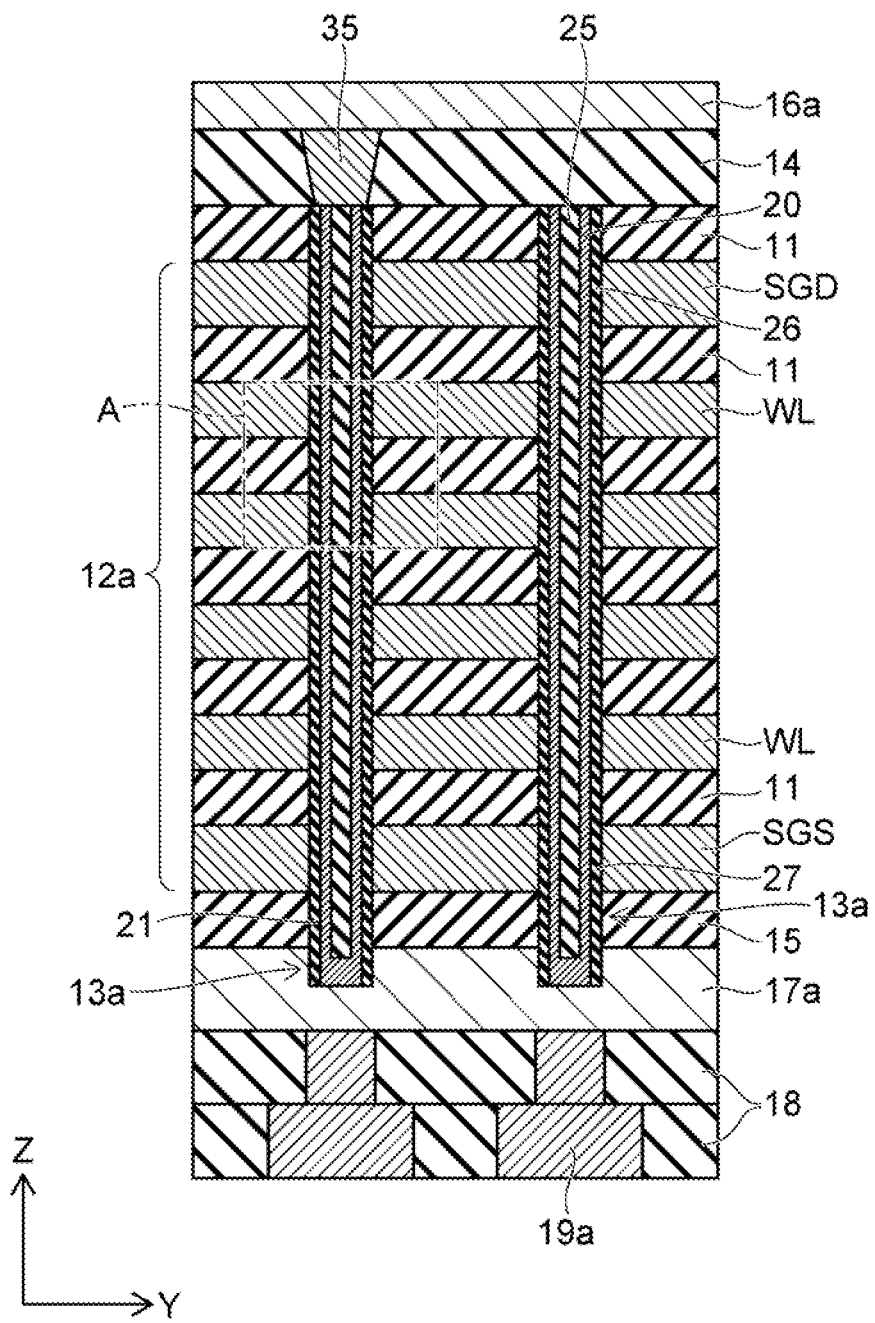
FIG. 3 is a schematic cross-sectional view illustrating the semiconductor memory device according to the first embodiment.
Figure 4:
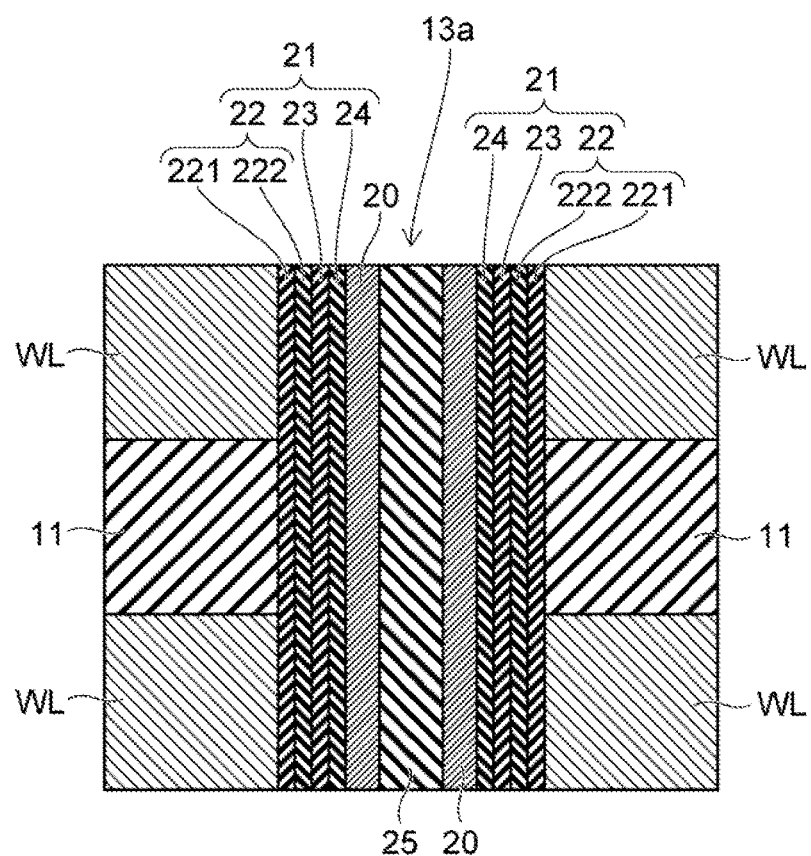
FIG. 4 is an enlarged schematic cross-sectional view illustrating a part of the semiconductor memory device according to the first embodiment.

FIG. 3 is a schematic cross-sectional view illustrating the semiconductor memory device according to the first embodiment and illustrating the vicinity of the first columnar portions. FIG. 4 is an enlarged schematic cross-sectional view illustrating a portion A depicted in FIG. 3. FIGS. 3 and 4 illustrate a cross section parallel to the YZ plane in FIG. 2.

As illustrated in FIG. 3, the first columnar portion 13a is formed inside an I-shaped memory hole formed inside the first stacked body 12a including a plurality of electrode layers WL and a plurality of insulating layers 11. A channel body 20, for serving as a semiconductor channel, is formed inside the memory hole. The channel body 20 is, for example, a silicon film. An impurity concentration of the channel body 20 is lower than an impurity concentration of the electrode layer WL.

As illustrated in FIG. 4, in a memory cell MC, a memory film 21 is formed between the inner wall of the memory hole and the channel body 20. The memory film 21 includes, for example, a block insulating film 22, a charge storage film 23, and a tunnel insulating film 24. Between the electrode layer WL and the channel body 20, the block insulating film 22, the charge storage film 23, and the tunnel insulating film 24 are formed in order from the electrode layer WL side.

The channel body 20 is formed in a cylindrical shape extending in the stacking direction of the stacked body. The memory film 21 is formed in a cylindrical shape while extending in the stacking direction of the stacked body to surround the outer circumferential surface of the channel body 20. The electrode layer WL surrounds the periphery of the channel body 20 via the memory film 21 interposed therebetween. A core insulating film 25 is formed inside the channel body 20. The core insulating film 25 is, for example, a silicon oxide film.

The block insulating film 22 comes into contact with the electrode layer WL, the tunnel insulating film 24 comes into contact with the channel body 20, and the charge storage film 23 is formed between the block insulating film 22 and the tunnel insulating film 24.

The channel body 20 functions as a channel of the memory cell MC and the electrode layer WL functions as a control gate of the memory cell. The charge storage film 23 functions as a data storage layer that stores charges injected from the channel body 20. That is, the memory cell MC that has a structure in which the control gate surrounds around the channel at an intersection of the channel body 20 and each electrode layer WL is formed.

The semiconductor memory device according to the first embodiment can be free to electrically execute erasing and writing data. Thus, the semiconductor memory device is a nonvolatile semiconductor memory device capable of retaining stored contents even when power is turned off.

The memory cell MC is, for example, a charge trapping memory cell. The charge storage film 23 has several trap sites trapping charges and is, for example, a silicon nitride film. The memory cell MC may be a floating gate memory cell.

The tunnel insulating film 24 becomes a potential barrier when charges are injected from the channel body 20 to the charge storage film 23 or when charges stored in the charge storage film 23 are diffused to the channel body 20. The tunnel insulating film 24 is, for example, a silicon oxide film.

Alternatively, a stacked film that has a structure in which a silicon nitride film is interposed between a pair of silicon oxide films may be used as the tunnel insulating film. This stacked film may be referred to as an ONO film (oxide-nitride-oxide film). When the ONO film is used as the tunnel insulating film, an erasing operation can be executed in a lower electric field as compared to a silicon oxide film of a single layer.

The block insulating film 22 prevents the charges stored in the charge storage film 23 from diffusing to the electrode layer WL. The block insulating film 22 includes, for example, a silicon nitride film 221 formed to come into contact with the electrode layer WL and a silicon oxide film 222 formed between the silicon nitride film 221 and the charge storage film 23.

By forming the silicon nitride film 221, which is a layer with a higher dielectric constant than the silicon oxide film 222, to be in contact with the electrode layer WL, it is possible to prevent back-tunneling electrons injected from the electrode layer WL at the time of erasing. That is, by using a stacked film of the silicon oxide film and the silicon nitride film as the block insulating film 35, it is possible to improve a charge blocking property.

As illustrated in FIGS. 2 and 3, the drain-side select transistor STD is formed in the upper portions of the first columnar portions 13a and the source-side select transistor STS is formed in the lower portions of the first columnar portions 13a.

The memory cell MC, the drain-side select transistor STD, and the source-side select transistor STS are vertical transistors in which a current flows in the stacking direction (the Z direction) of the stacked body.

The drain-side selection gate SGD functions as a gate electrode, which may also be referred as a control gate, of the drain-side select transistor STD. An insulating film 26 (see FIG. 3) that functions as a gate insulating film of the drain-side select transistor STD is formed between the drain-side selection gate SGD and the channel body 20. The channel body 20 of the drain-side select transistor STD formed in the first columnar portion 13a is connected to a bit line BL above the drain-side selection gate SGD.

The source-side selection gate SGS functions as a gate electrode of the source-side select transistor STS. An insulating film 27 (see FIG. 3) that functions as a gate insulating film of the source-side select transistor STS is formed between the source-side selection gate SGS and the channel body 20. The channel body 20 of the source-side select transistor STS formed in the first columnar portion 13a is connected to a source line SL below the source-side selection gate SGS.

A first source-side wiring layer 19a is formed inside the interlayer insulating layer 18 further below the source line SL.

The plurality of memory cells MC, the drain-side select transistor STD, and the source-side select transistor STS are connected in series through the channel body 20 to configure one "I-shaped" memory string MS. By arranging the plurality of memory strings MS in the X and Y directions, the plurality of memory cells MC are arranged 3-dimensionally in the X, Y, and Z directions.

FIG. 1 illustrates a region of an end of the first memory cell array 10a in the X direction. A stair structure 29 formed by the electrode layers WL extending in the X direction is formed at an end of a first memory cell array region 28a. In the stair structure 29, the X direction ends of the electrode layers WL are formed in a stair shape. A plurality of contact plugs 30 connected to each of the electrode layers WL are formed in the stair structure 29. The contact plugs 30 are connected to each of the electrode layers WL of the layers in the stair shape and penetrate through the interlayer insulating layer 31.

In the stair structure 29, the selection gates SG (the drain-side selection gate SGD and the source-side selection gate SGS) are connected to contact plugs 32.

The contact plug 30 (connected to the electrode layer WL) is connected a word wiring layer 33. The contact plug 32 (connected to the selection gate SG) is connected to a selection gate wiring layer 34. The word wiring layer 33 and the selection gate wiring layer 34 are formed in the same device layer. A device layer may be referred to as a device level or wiring level.

The first memory cell array layer 200 does not include a substrate. A first source-side wiring layer 19a is formed to be closer to the second surface side than a first source line SL.

At least parts of the word wiring layer 33 and the selection gate wiring layer 34 are led out as a word-line lead portion 35 and a selection-gate-line lead portion 36, via other wiring layers or plugs, to the outside of the first memory cell array region 28a when viewed in a direction perpendicular to the first surface. The word-line lead portion 35 and the selection-gate-line lead portion 36 are connected to a first signal line extraction electrode 37a (see FIG. 1) formed outside the first memory cell array region 28a.

The channel body 20 of the first columnar portion 13a is electrically connected to the first bit line BL and the first source line SL. Similarly, at least parts of the first bit line BL and the first source line SL are led out as a first bit-line lead portion and a first source-line lead portion (not separately illustrated) via other wiring layers or plugs to the outside of the first memory cell array region 28a when viewed in a direction perpendicular to the first surface. The first bit-line lead portion and the first source-line lead portion are connected to a first signal line extraction electrode 37a formed outside the first memory cell array region 28a.

A first surface wiring layer 38a and a second surface wiring layer 39a are formed on the first surface Sa1 and the second surface Sa2 of the first memory cell array layer 200. The first surface wiring layer 38a and the second surface wiring layer 39a are embedded in the first surface Sa1 and the second surface Sa2, respectively, so that surface portions are exposed from interlayer insulating layers. Here, for example, a first signal line extraction electrode 37a is electrically connected to the first surface wiring layer 38a and the second surface wiring layer 39a formed on the first surface Sa1 and the second surface Sa2 of the first memory cell array layer 200, respectively. The first signal line extraction electrode 37a, the first surface wiring layer 38a, and the second surface wiring layer 39a penetrate through the first memory cell array layer 200 in the Z direction.

First external connection electrodes 40a are formed outside the first memory cell array region 28a. That is, the first external connection electrodes 40a are formed in a region further beyond the stair structure in the memory cell array in the X direction. The first external connection electrodes 40a are electrically connected to the first surface wiring layer 38a and the second surface wiring layer 39a formed on the first surface Sa1 and the second surface Sa2 of the first memory cell array layer 200. The first surface wiring layer 38a and the second surface wiring layer 39a are embedded in the first surface Sa1 and the second surface Sa2, respectively, so that surface portions are exposed from the interlayer insulating layers. The first external connection electrode 40a, the first surface wiring layer 38a, and the second surface wiring layer 39a penetrate through the first memory cell array layer 200.

The peripheral circuit layer 100 includes a circuit board 1. The circuit board 1 is, for example, a silicon substrate. A control circuit is formed on a circuit formation surface of the circuit board 1. As the control circuit, an integrated circuit including a transistor is formed. The transistor has a MOSFET structure that has a gate electrode and a source/drain region. The source/drain regions of the MOSFET are connected to a circuit-side connection electrode 41 by another wiring layer or a plug. The circuit-side connection electrode 41 is electrically connected to a circuit-side wiring layer 42 formed on the circuit formation surface of the peripheral circuit layer 100. The circuit-side wiring layer 42 is embedded in the circuit formation surface so that a surface portion is exposed from an interlayer insulating layer.

The second memory cell array layer 300 has the same configuration as the first memory cell array layer 200 (illustrated in FIGS. 1 to 4). The second memory cell array layer 300 includes a third surface Sb1 and a fourth surface Sb2 opposite to the third surface in FIG. 1 and includes a second memory cell array 10b having a 3-dimensional structure.

The second memory cell array layer 300 does also not include a substrate. A second source-side wiring layer 19b is further formed to be closer to the fourth surface than the second source line SL.

As in the first memory cell array layer 200, at least parts of the word wiring layer 33 and the selection gate wiring layer are led out as a word-line lead portion 35 and a selection-gate-line lead portion 36 via other wiring layers or plugs to the outside of a second memory cell array region 28b when viewed in a direction perpendicular to the third surface. The word-line lead portion 35 and the selection-gate-line lead portion 36 are connected to a second signal line extraction electrode 37*b* formed outside the second memory cell array region 28*b*.

The channel body 20 of the second columnar portion 13*b* is electrically connected to the second bit line BL and the second source line SL. Similarly, at least parts of the second bit line BL and the second source line SL are led out as a second bit-line lead portion and a second source-line lead portion by other wiring layers or plugs to the outside of the second memory cell array region 28*b* when viewed in the direction perpendicular to the third surface. The second bit-line lead portion and the second source-line lead portion are connected to the second signal line extraction electrode 37*b* formed outside the second memory cell array region 28*b*. The internal configuration of the second memory cell array region 28*b* is the same as that of the first memory cell array layer 200, and thus reference numerals are not separately given.

A third surface wiring layer 38*b* and a fourth surface wiring layer 39*b* are formed on the third surface Sb1 and the fourth surface Sb2 of the second memory cell array layer 300. The third surface wiring layer 38*b* and the fourth surface wiring layer 39*b* are embedded in the third surface Sb1 and the fourth surface Sb2, respectively, so that surface portions are exposed from interlayer insulating layers. Here, for example, the second signal line extraction electrode 37*b* is electrically connected to the third surface wiring layer 38*b* and the fourth surface wiring layer 39*b* formed on the third surface and the fourth surface of the second memory cell array layer 300, respectively. The second signal line extraction electrode and the third and fourth surface wiring layers penetrate through the second memory cell array layer 300 in the Z direction.

Second external connection electrodes 40*b* are formed outside the second memory cell array region 28*b*. That is, the second external connection electrodes 40*b* are formed in a region further beyond the stair structure in the memory cell array in the X direction. The second external connection electrodes 40*b* are electrically connected to the third surface wiring layer 38*b* and the fourth surface wiring layer 39*b* formed on the third surface Sb1 and the fourth surface Sb2. The third surface wiring layer 38*b* and the fourth surface wiring layer 39*b* are embedded in the third surface Sb1 and the fourth surface Sb2, respectively, so that surface portions are exposed from interlayer insulating layers. The second external connection electrodes 40*b*, the third surface wiring layer 38*b*, and the fourth surface wiring layer 39*b* penetrate through the second memory cell array layer 300 in the Z direction. An external connection pad 52 is formed on a surface wiring layer electrically connected to the second external connection electrodes 40*b* among the fourth surface wiring layers 39*b*.

As illustrated in FIG. 1, the first surface wiring layer 38*a* formed on the first surface Sa1 is bonded to the circuit-side wiring layer 42 formed on the circuit formation surface of substrate 1. The first surface wiring layer 38*a* and the circuit-side wiring layer 42 are formed of, for example, copper or copper alloys which have copper as a main component. An insulating film (not specifically illustrated) is formed around the first surface wiring layer 38*a* and the circuit-side wiring layer 42. The insulating film is, for example, an inorganic film or a resin film. The first memory cell array layer 200 and the peripheral circuit layer 100 are electrically connected via the first surface wiring layer 38*a* and the circuit-side wiring layer 42.

As illustrated in FIG. 1, the second surface wiring layer 39*a* formed on the second surface Sa2 is bonded to the third surface wiring layer 38*b* formed on the third surface Sb1. The second surface wiring layer 39*a* and the third surface wiring layer 38*b* are formed of, for example, copper or copper alloys which have copper as a main component. An insulating film (not specifically illustrated) is formed around the second surface wiring layer 39*a* formed on the second surface and the third surface wiring layer 38*b* formed on the third surface Sb1. The insulating film is, for example, an inorganic film, such as a silicon nitride film. The first memory cell array layer 200 and the second memory cell array layer 300 are electrically connected via the second surface wiring layer 39*a* and the third surface wiring layer 38*b*.

When the insulating film around the wiring layers is an inorganic film, the facing wiring layers can be bonded to each other on the bonding surfaces and the facing inorganic films can be bonded using hydrogen bonding. Accordingly, when the inorganic film is used as the insulating film, a gap between the bonding surfaces is unlikely. Therefore, it is preferable to use inorganic films since it is typically not necessary to perform an under-fill processing using a resin material to fill gaps.

Figure 5:
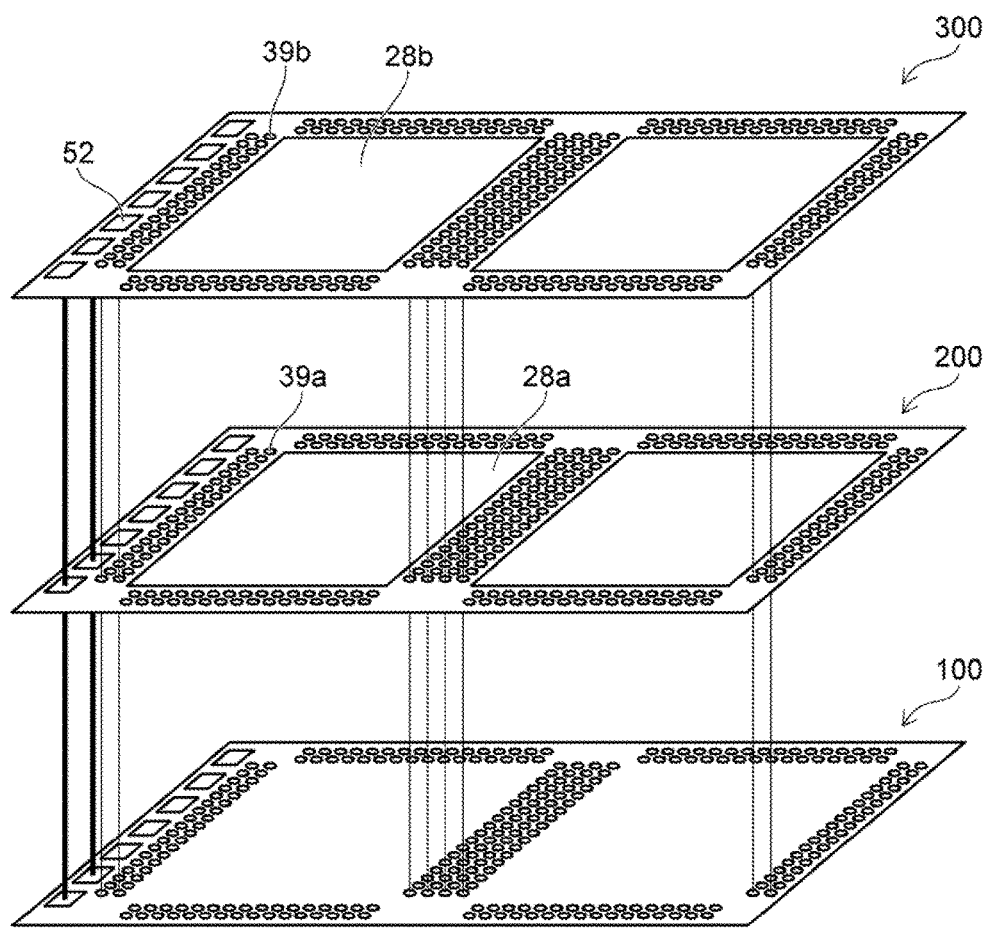
FIG. 5 is a schematic perspective view illustrating the semiconductor memory device according to the first embodiment.

FIG. 5 is a schematic perspective view illustrating the semiconductor memory device according to the first embodiment and illustrating an electric connection state of the peripheral circuit layer, the first memory cell array layer, and the second memory cell array layer.

As illustrated in FIG. 5, the peripheral circuit layer 100, the first memory cell array layer 200, and the second memory cell array layer 300 are electrically connected by the first signal line extraction electrodes, the second signal line extraction electrodes, the first external connection electrodes, and the second external connection electrodes (not illustrated). The signal line extraction electrodes are formed outside the memory cell array regions 28*a* and 28*b* and the external connection electrodes are formed in a region which is outside the memory cell array regions and the stair structure in the memory cell array. The signal line extraction electrode and the external connection electrode of the memory cell array layer are formed in overlapping regions when viewed in the direction perpendicular to the first surface Sa1. The signal line extraction electrode is electrically connected to the surface wiring layers 39*a* and 39*b* and the external connection electrode of the second memory cell array layer 300, which is the uppermost layer, is electrically connected to the external connection pad 52. In FIG. 5, only parts of electric connection states of the first signal line extraction electrodes, the second signal line extraction electrodes, the first external connection electrodes, and the second external connection electrodes are illustrated and the other parts are not illustrated.

A method of manufacturing the semiconductor memory device according to the first embodiment will be described with reference to FIGS. 6 to 9. FIGS. 6 to 9 are diagrams illustrating a cross-section of the semiconductor memory device during different manufacturing stages of the semiconductor memory device according to the first embodiment.

Figure 6:
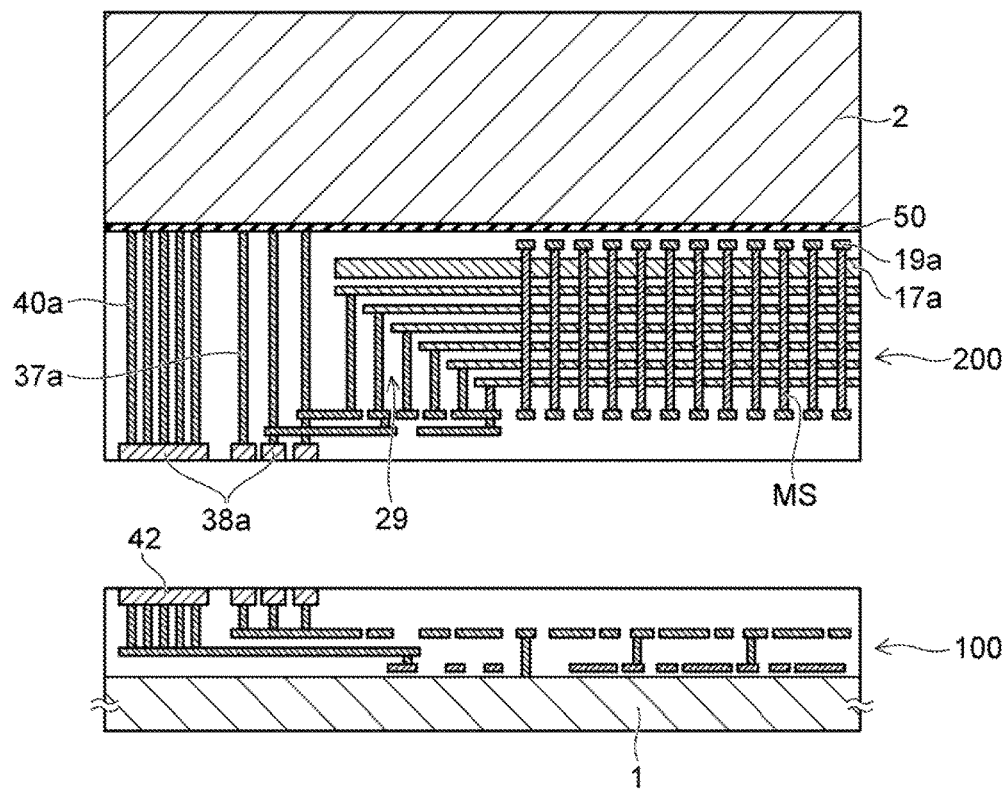
FIGS. 6-9 are schematic cross-sectional views illustrating aspects of a method of manufacturing a semiconductor memory device according to the first embodiment.

As illustrated in FIG. 6, a control circuit including transistors and the like are formed on the circuit board 1 and the peripheral circuit layer 100 (including the circuit-side wiring layer 42 of which a front surface is exposed from the insulating film) is formed. The first insulating layer 50, serving as a buffer layer, for example, a silicon oxide film under another substrate 2, is formed, the first source-side wiring layers 19a and the first source line 17a are formed under the first insulating layer 50, and the first selection gates SG, the plurality of electrode layers WL, and the like are formed under the first source line 17a. Next, the memory strings MS, the stair structure 29, and the like are formed. Further, the first external connection electrodes 40a, the first signal line extraction electrodes 37a, and the first surface wiring layers 38a are formed to form the first memory cell array layer 200. Subsequently, the circuit-side wiring layer 42 of the peripheral circuit layer 100 and the first surface wiring layer 38a of the first memory cell array layer 200 are stacked to face each other.

Figure 7:
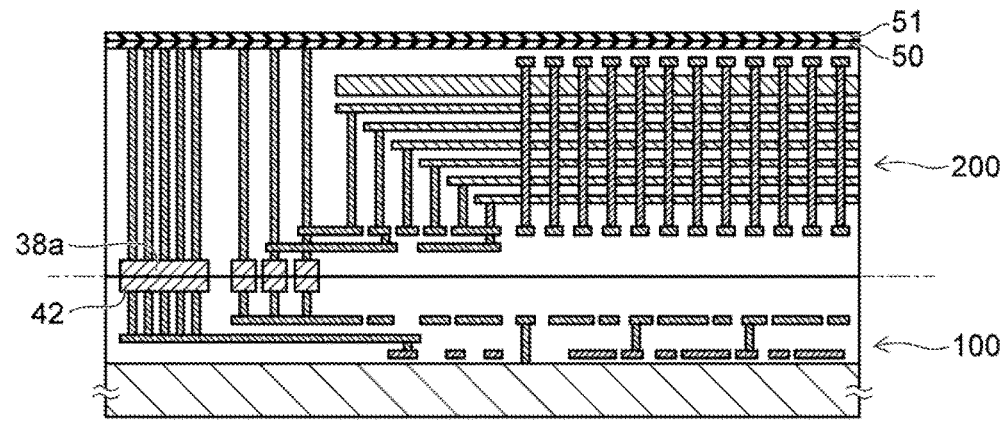

Next, as illustrated in FIG. 7, the peripheral circuit layer 100 and the first memory cell array layer 200 are stacked on each other. At this time, the circuit-side wiring layer 42 and the first surface wiring layer 38a are bonded to each other. As a bonding method, for example, these layers are bonded by applying a mechanical pressure for diffusion bonding. Alternatively, an inert plasma treatment is performed on the bonding surfaces and the layers are bonded using hydrogen bond produced by forming hydroxyl groups on the bonding surfaces. Alternatively, these layers are bonded using an organic adhesive or the like. Thereafter, the substrate 2 can be removed using a chemical liquid etchant such as KOH. At this time, the facing insulating films around the wiring layers can also be bonded.

Since the memory cell array layer (200) does not include a substrate (after removal of substrate 2), deformation occurs due to stresses applied and the stacked semiconductor memory device may be bent or bowed. Accordingly, a second insulating layer 51 is formed. The second insulating layer 51 is a layer that has stress opposing to a bend/bow state of the memory cell layer (200) occurring after the substrate 2 has been removed. That is, the second insulating layer 51 is formed as a stress adjusting film. As the second insulating film 51, for example, a silicon nitride film is formed. In this way, it is possible to alleviate stress occurring in the semiconductor memory device, and thus it is possible to prevent a warped state in the semiconductor memory device.

Figure 8:
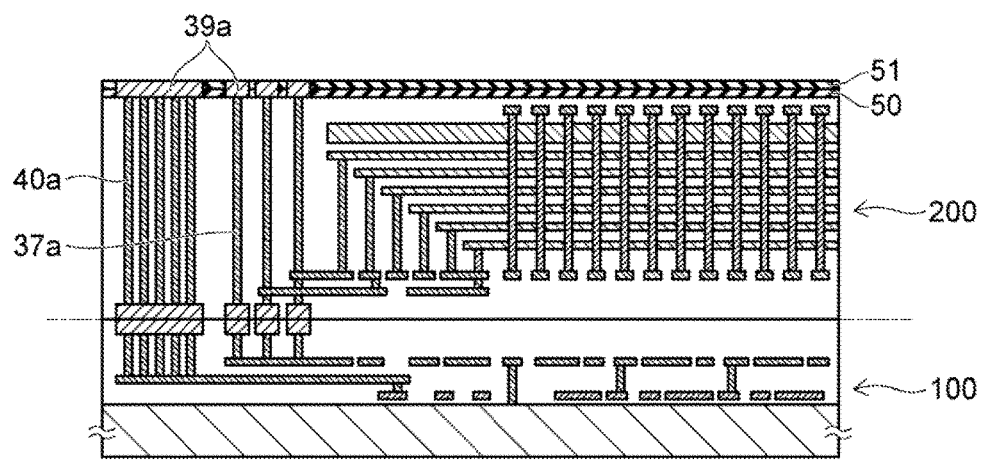

Next, portions of the first insulating layer 50 and the second insulating layer 51 are removed to form grooves or trenches so that the upper surfaces of the first external connection electrodes 40a and the first signal line extraction electrodes 37a are exposed. As illustrated in FIG. 8, the second surface wiring layers 39a which are bonding metals are formed in the grooves such that the upper surfaces of the second surface wiring layers 39a are exposed.

Figure 9:
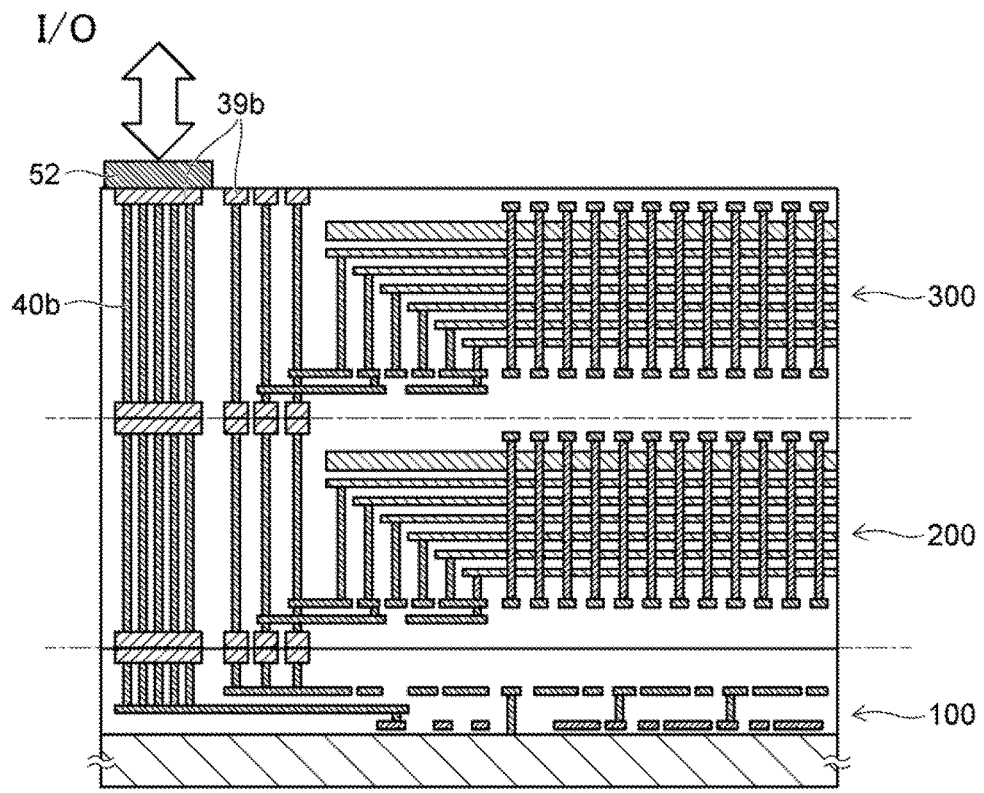

Next, the same processes as those in FIGS. 6 to 8 are repeated though with the first memory cell array layer 200 being the uppermost layer instead of the peripheral circuit layer 100 and with the second memory cell array layer 300 being stacked instead of the first memory cell array layer 200. As illustrated in FIG. 9, external connection pad 52 is formed on the surface wiring layer electrically connected to the second external connection electrodes 40b among the fourth surface wiring layers 39b exposed to the upper surfaces. In this way, it is possible to form the semiconductor memory device in which the peripheral circuit layer 100, the first memory cell array layer 200, and the second memory cell array layer 300 are stacked.

In the first embodiment, the second memory cell array layer 300 is stacked on the first memory cell array layer 200. However, another memory cell array layer (or two or more memory cell layers) may be stacked on the second memory cell array layer 300. If additional memory cell layers are added to the device stack, at least some of the other memory cell array layers may include a substrate so as to reduce a bent or warped state of the stacked semiconductor memory device.

Also, a stacked body of memory cell array layers may be formed without including the peripheral circuit layer 100 in the stack.

First Modification Example

Figure 10:
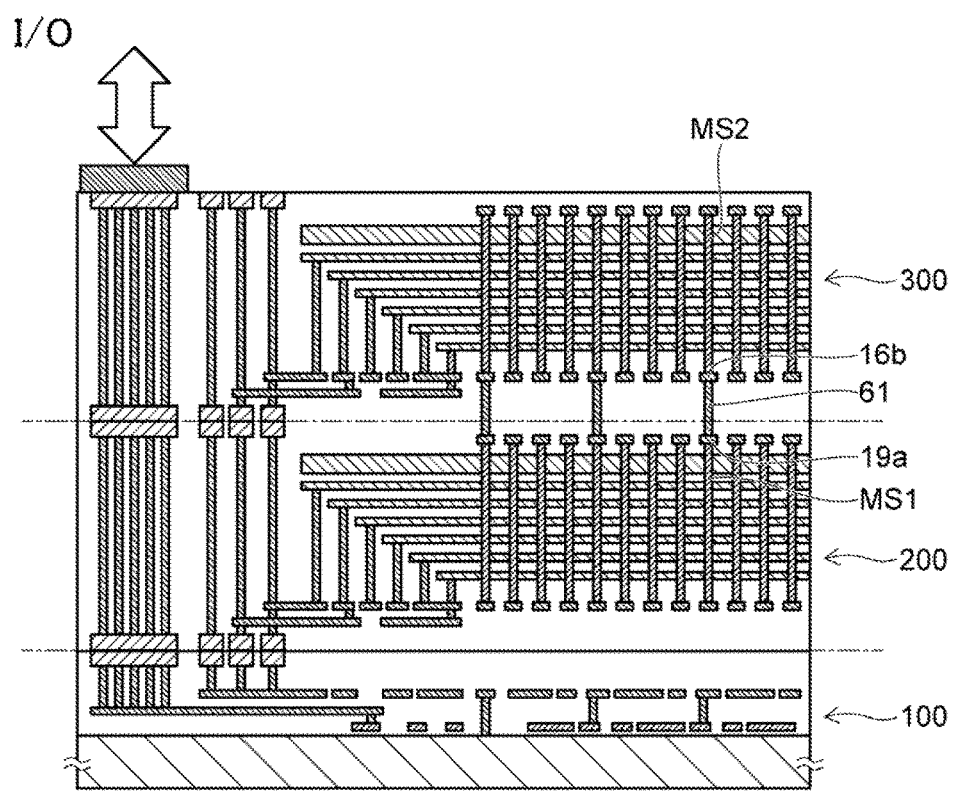
FIG. 10 is a schematic cross-sectional view illustrating a semiconductor memory device according to a first modification example of the first embodiment.

FIG. 10 is a schematic sectional view illustrating the semiconductor memory device according to a first modification example of the first embodiment. A wiring layer 61 is formed to connect a memory string MS1 of the first memory cell array layer 200 to a memory string MS2 of the second memory cell array layer 300. The wiring layer 61 is formed inside the memory cell array region and is connected to the first source-side wiring layer 19a of the first memory cell array layer 200 and the second bit line 16b of the second memory cell array layer 300. The first memory cell array layer and the second memory cell array layer are connected without interposing signal line extraction electrodes at the outside of the memory cell array region.

In the first modification example, the first memory cell array layer 200 and the second memory cell layer 300 are connected using wiring layers formed inside the memory cell array region in addition to the signal line extraction electrodes formed outside the memory cell array regions.

By forming the semiconductor memory device in this way, it is possible to reduce electrode areas necessary for connecting the memory cell array layers, and thus it is possible to reduce chip areas.

Second Modification Example

Figure 11:
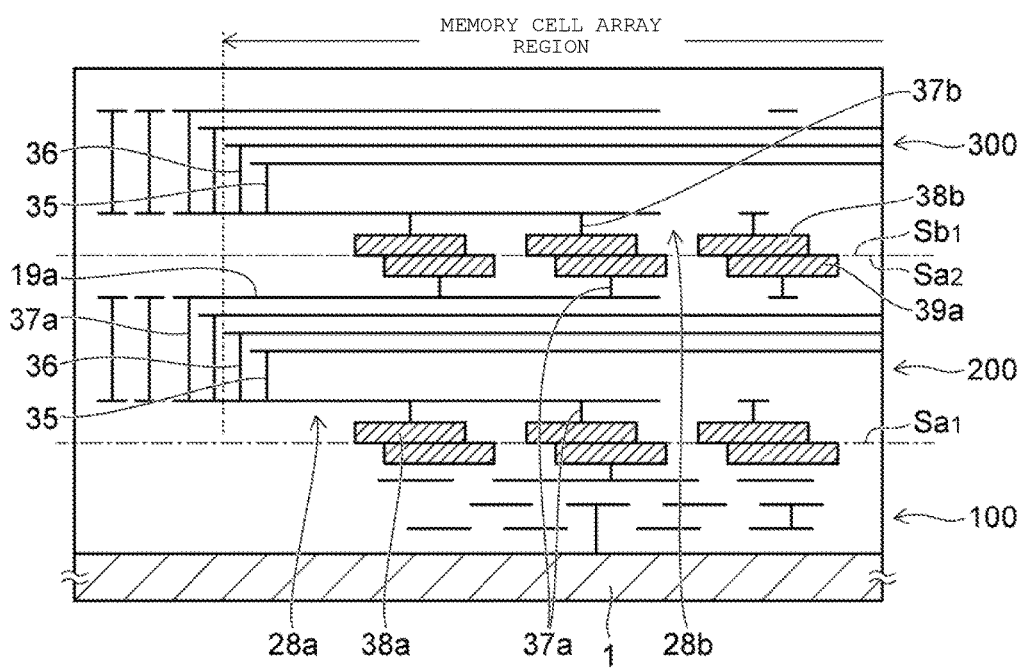
FIG. 11 is a schematic cross-sectional view illustrating a semiconductor memory device according to a second modification example of the first embodiment.

FIG. 11 is a schematic sectional view illustrating the semiconductor memory device according to a second modification example of the first embodiment. The external connection electrode aspects are not specifically depicted since they are repetitive with other examples.

At least parts of the word wiring layer and the selection gate wiring layer of the first memory cell array layer 200 are respectively led out as the word-line lead portion 35 and the selection-gate-line lead portion 36 by other wiring layers or plugs and are routed inside the first memory cell array region 28a when viewed in a direction perpendicular to the first surface Sa1. The word-line lead portion 35 and the selection-gate-line lead portion 36 inside the first memory cell array region 28a are connected to the first signal line extraction electrodes 37a that are formed inside the first memory cell array region 28a.

Similarly, at least parts of the first bit line BL and the first source line SL are respectively led out as a first bit-line lead portion and a first source-line lead portion by other wiring layers or plugs and are routed inside the first memory cell array region 28a when viewed in a direction perpendicular to the first surface Sa1. The first bit-line lead portion and the first source-line lead portion inside the first memory cell array region 28a are connected to the first signal line extraction electrode 37a formed inside the first memory cell array region 28a.

The first source-side wiring layer 19a on the side of the second surface Sa2 is connected to the first signal line extraction electrode 37a formed inside the first memory cell array region 28a. Here, some of the first signal line extraction electrodes 37a may be formed outside the first memory cell array region 28a.

The first surface wiring layer 38a and the second front surface wiring layer 39a are formed on the first surface Sa1 and the second surface Sa2 of the first memory cell array layer 200, respectively, inside the memory cell array region. The first surface wiring layer 38a and the second surface wiring layer 39a formed inside the memory cell array region are electrically connected to the first signal line extraction electrodes 37a.

As in the first memory cell array layer 200, at least parts of the word wiring layer and the selection gate wiring layer of the second memory cell array layer 300 are respectively led out as the word-line lead portion 35 and the selection-gate-line lead portion 36 by other wiring layers or plugs and are routed inside the second memory cell array region 28b when viewed in a direction perpendicular to the third surface Sb1. The word-line lead portion 35 and the selection-gate-line lead portion 36 led inside the second memory cell array region 28b are connected to the second signal line extraction electrodes 37b formed inside the second memory cell array region 28b.

In addition, at least parts of the second bit line BL and the second source line SL are respectively led out as a second bit-line lead portion and a second source-line lead portion by other wiring layers or plugs and are routed inside the second memory cell array region 28b when viewed in a direction perpendicular to the third surface Sb1. The second bit-line lead portion and the second source-line lead portion inside the second memory cell array region 28b are connected to the second signal line extraction electrode 37b formed inside the second memory cell array region 28b. Some of the second signal line extraction electrodes 37b may also be formed outside the second memory cell array region 28b.

On the third surface Sb1 of the second memory cell array layer 300, the third front surface layer 38b is formed inside the memory cell array region. The third surface wiring layer 38 formed inside the memory cell array region is electrically connected to the second signal line extraction electrode 37b. Here, on the fourth surface Sb2 of the second memory cell array layer 300, the fourth surface wiring layer (not specifically illustrated) may be formed inside the memory cell array region. In this case, the fourth surface wiring layer formed inside the memory cell array region is electrically connected to a second signal line extraction electrode 37b.

Accordingly, the signal line extraction electrodes of each memory cell array layer are connected to the surface wiring layer formed inside the memory cell array region and the surface wiring layer of each memory cell array layer can be formed in overlapping regions when viewed in the direction perpendicular to the first surface. Accordingly, when the plurality of memory cell array layers is stacked, it is possible to further reduce chip areas and reduces wiring lengths, and thus it is possible to prevent operational delay.

According to the second modification example, at least some of the bit lines or the word lines are folded inside the memory cell array region. The signal line extraction electrodes connected via the bit-line lead portion and the word-line lead portion are formed inside the memory cell array region. The signal line extraction electrode of each memory cell array layer is connected to the surface wiring layer formed inside the memory cell array region and the surface wiring layer of each memory cell array layer can be formed in each overlapping region when viewed in the direction vertical to the first surface. Accordingly, when the plurality of memory cell array layers is stacked, it is possible to further reduce chip areas and reduce wiring lengths, and thus it is possible to prevent operation delay.

According to the first embodiment, the first memory cell array layer 200 and the second memory cell array layer 300 do not include a substrate. Accordingly, when first memory cell array layer 200 and the second memory cell array layer 300 are stacked and electrically connected, these layers can be connected without forming a through-silicon via (TSV) or the like. Accordingly, it is not necessary to perform a deep substrate etching process which is costly and time consuming or likewise to form an insulating film to prevent short-circuiting between the etched substrate and the TSV. Thus, it is possible to achieve a reduction in cost and an improvement in a throughput.

The memory cell array layer and the peripheral circuit layer are, in general, formed in separate wafer processes. Therefore, even when a high-temperature process is necessary for forming the memory cell array layer, it is possible to prevent impurity diffusion of the transistors of the peripheral circuit layer or an adverse influence such as deterioration in a metal wiring layer.

The memory cell array layer is stacked so that the first surface faces the peripheral circuit layer. The bit line or the word line is led out to the first surface of the memory cell array layer and the bit line or the word line is connected to the signal line extraction electrode. Since the memory cell array layer is stacked so that the first surface faces the peripheral circuit layer, it is possible to reduce a routing distance of the electrode layer, and thus it is possible to prevent an adverse influence on an operation speed.

Further, according to the first embodiment, the memory cell array layers of the plurality of layers are stacked on the peripheral circuit layer. Accordingly, when the stacked body of one memory cell array layer has 48 layers, a memory cell array having 96 layers, which is a double of 48 layers, can be realized, for example, using a process technique for 48 layers by stacking two memory cell array layers. Accordingly, it is possible to improve a memory density.

Further, at least some of the bit lines or the word lines are led outside the memory cell array region, and the signal line extraction electrodes connected via the bit-line lead portion and the word-line lead portion are formed outside the memory cell array region. In addition, external connection electrodes are formed in a region which is outside the memory cell array region and is further outside the stair structure in the memory cell array. The signal line extraction electrode and the external connection electrode of each memory cell array layer are formed in each overlapping region when viewed in the direction perpendicular to the first surface. Accordingly, when the plurality of memory cell array layers is stacked, it is possible to reduce wiring lengths, and thus it is possible to prevent operation delay.

Alternatively, at least some of the bit lines or the word lines can be repeated inside the memory cell array region. The signal line extraction electrode connected via the bit-line lead portion and the word-line lead portion is formed inside the memory cell array region. The signal line extraction electrode of each memory cell array layer is connected to the surface wiring layer formed inside the memory cell array region and the surface wiring layer of each memory cell array layer is formed in each overlapping region when viewed in the direction vertical to the first surface. Accordingly, when the plurality of memory cell array layers is stacked, it is possible to further reduce chip areas and reduce wiring lengths, and thus it is possible to prevent operation delay.

The external connection electrode and the surface wiring layer connected to the external connection electrode are formed at least to penetrate a layer (here, the first memory cell array layer) vertically interposed by the memory cell array layer or/and the peripheral circuit layer. The signal line extraction electrode and the surface wiring layer connected to the signal line extraction electrode are formed at least to penetrate a layer (here, the first memory cell array layer) vertically interposed by the memory cell array layer or/and the peripheral circuit layer. Accordingly, when a plurality of memory cell array layers is stacked, it is possible to further reduce wiring lengths. Thus, it is possible to further prevent operation delay and improve reliability.

Further, the external connection electrode can have layout not connected to a memory cell and an external signal can be input from the external connection pad to the peripheral circuit layer without interposing the memory cell. In this way, it is possible to further prevent an adverse influence on operation delay or the like. Since the signal line extraction electrode is electrically connected to each memory cell array layer even in a route of non-connection to the memory cell, a signal line of each layer is connected to the signal line extraction electrode without interposing the memory cell. In this way, it is possible to further prevent an adverse influence on operation delay or the like.

The memory cell array layer does not include a substrate and it is not necessary to form silicon through electrode such as TSV. On the side of the second surface (the side of the fourth surface) of the memory cell array layer, the source-side wiring layer is formed instead of forming a substrate. Accordingly, it is possible to connect the stacked memory cell array layer to any layer and it is possible to increase wiring regions without an increase in chip areas.

Further, the first source-side wiring layer can be used as the first source-line lead portion of the first source line SL. The second source-side wiring layer can be used as the second source-line lead portion of the second source line SL. In this way, by forming the source-side wiring layer on the side of the second surface (the side of the fourth surface) of the source line in the memory cell array which includes the memory cell string in which the columnar portion has the I shape, it is possible to efficiently reduce a wiring length from the source line to the signal line extraction electrode.

The signal line extraction electrode and the surface wiring layer of the second memory cell array layer may be formed to penetrate the second memory cell array layer, as in the first memory cell array layer. It may be preferable to penetrate the second memory cell array layer in this manner so that a device structure can be common to the first memory cell array layer and the second memory cell array layer and matching characteristics such as stress occurring in the memory cell array layer can be achieved. Similarly, it may be preferable to penetrate the second memory cell array layer in that manufacturing processes can be common to the first memory cell array layer and the second memory cell array layer and the memory cell array layers for stacking can efficiently be manufactured.

In the first memory cell array layer or the second memory cell array layer, the bit line or the word line is led out to the side of the first surface or the side of the third surface, respectively, and the bit line or the word line is connected to the signal line extraction electrode. The first memory cell array layer is stacked so that the first surface faces the peripheral circuit layer and the second memory cell array layer is stacked so that the third surface faces the first memory cell array layer. That is, the first memory cell array layer and the second memory cell array layer are stacked so that the signal lines are led out in the same direction and directions of the first memory cell array layer and the second memory cell array layer are uniform. In this way, since the bit lines and the word lines are led to a same side (the lower side in FIG. 1) on which the peripheral circuit layer is formed and are stacked on the peripheral circuit layer, it is possible to reduce a routing distance of the electrode layer, and thus it is possible to prevent an adverse influence on an operation speed.

When the first memory cell array layer and the second memory cell array layer are stacked to face each other without being uniform in the directions thereof, it may be necessary to provide one of the memory cell array layers on, for example, a tape, remove a substrate from the tape, and stack the memory cell array layer so that the surface on which the substrate is removed faces the peripheral circuit layer or the other memory cell array layer. When the first memory cell array layer and the second memory cell array layer are stacked so that the directions thereof are uniform, it is not necessary to use a tape or the like. That is, the memory cell array layer can be formed by stacking the memory cell array layer formed on the substrate on the peripheral circuit layer so that the front surface of the substrate is upward and removing the substrate. Accordingly, it is preferable to stack the first memory cell array layer and the second memory cell array layer so that the directions thereof are uniform in that the first memory cell array layer and the second memory cell array layer are easily formed without using a tape or the like.

Second Embodiment

Next, a semiconductor memory device according to a second embodiment will be described. The basic configuration is the same as that of the first embodiment. Therefore, the matters described in the first embodiment will not be described.

Figure 12:
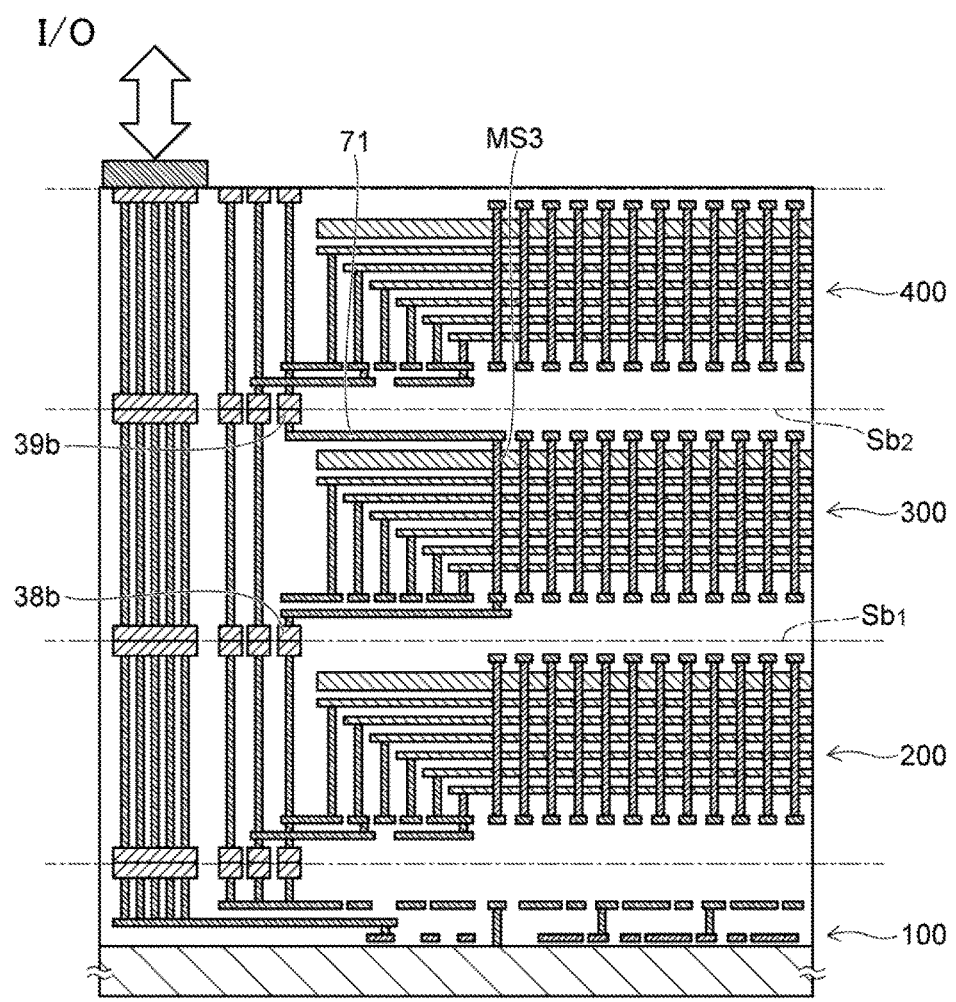
FIG. 12 is a schematic cross-sectional view illustrating a semiconductor memory device according to a second embodiment.

FIG. 12 is a schematic cross-sectional view illustrating the semiconductor memory device according to the second embodiment. In FIG. 12, one memory cell array layer is further stacked on the semiconductor memory device in FIG. 1. The peripheral circuit layer 100, the first memory cell array layer 200, the second memory cell array layer 300, and the third memory cell array layer 400 are formed in order from the lower side.

Here, as illustrated in FIG. 12, in the stacked second memory cell array layer 300, a wiring layer 71 connected to a memory string MS3 is formed between a third surface wiring layer 38b formed on the third surface Sb1 and a fourth surface wiring layer 39b formed on the fourth surface Sb2. That is, the second memory cell array layer 300 is connected to the upper and lower memory cell array layers by the wiring layer 71 via the memory string MS3.

Figure 13:
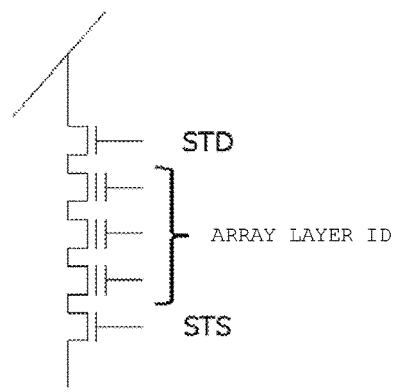
FIG. 13 is a circuit diagram of the semiconductor memory device according to the second embodiment.

FIG. 13 is a circuit diagram of the semiconductor memory device according to the second embodiment. FIG. 13 illustrates a part of a circuit of the memory string MS3 connected to the wiring layer 71. A plurality of memory cells is formed (and some of the memory cells are not specifically illustrated). In the plurality of memory cells, the drain-side select transistor STD and the source-side select transistor STS are formed and an array layer ID formed for each memory cell array layer is stored. The circuit of the memory string MS3 functions as a part of an array layer selection circuit for selecting an array layer.

Figure 14:
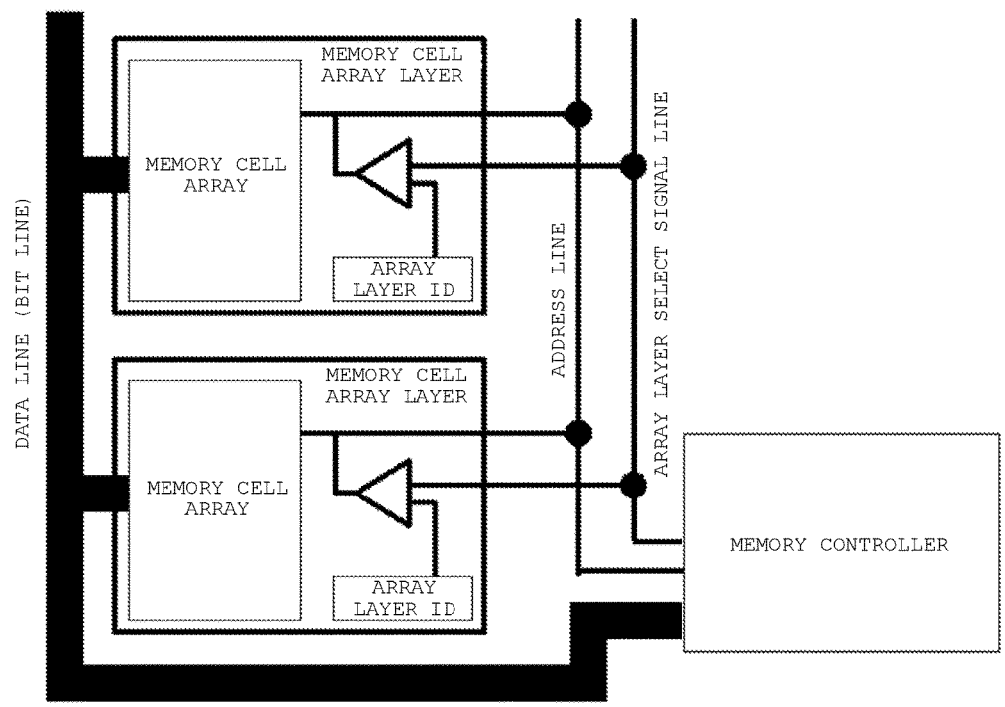
FIG. 14 is a block diagram illustrating a configuration of a system of the semiconductor memory device according to the second embodiment.

FIG. 14 is a block diagram illustrating a configuration of a system of the semiconductor memory device according to the second embodiment. FIG. 14 illustrates the configuration of the system of the semiconductor memory device including the array layer selection circuit formed in the memory string MS3 connected to the wiring layer 71.

In each memory cell array layer, an address line and an array layer select signal line are provided as signal lines. Whether the memory cell array layer is selected is determined in accordance with signals on the array layer select signal line and the address line input to a memory cell array corresponding to the stored array layer ID.

By forming the semiconductor memory device in this way, a memory cell array layer can be selected using a transistor and a memory cell inside the memory string MS3 without individually selecting the memory cell array using each signal line. Thus, even in the semiconductor memory device including a plurality of stacked memory cell array layers, it is possible to considerably reduce the number of wirings.

In this way, each memory cell array layer may be connected to the upper and lower memory cell array layers using the wiring layer 71 for each memory block or memory area of the second memory cell array layer. By forming the semiconductor memory device in this way, the memory area or the memory block can be selected using a transistor and a memory cell in each memory string MS.

Example embodiments have been described with reference to the drawings. However, the present disclosure is not limited thereto.

In the present disclosure, an example in which a circuit board 1 is included has been described. However, a case in which only memory cell array layers are stacked is also included in the scope of the present disclosure.

Various design changes in the configuration of the memory cell array for realizing the present disclosure can be made by those skilled in the art and are included in the scope of the present disclosure without departing from the gist of the present disclosure.

According to still another aspect of the present disclosure, a semiconductor memory device including 3-dimensional memory cell arrays with different configurations is provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a first memory cell array layer having a first surface, a second surface opposite to the first surface, a first memory cell array region in which a first plurality of memory cells is 3-dimensionally arrayed, and a first surface wiring layer and a second surface wiring layer at the first surface and the second surface, respectively, and connected to the first plurality of memory cells; and
a second memory cell array layer having a third surface, a fourth surface opposite the third surface, a second memory cell array region in which a second plurality of memory cells is 3-dimensionally arrayed, and a third surface wiring layer and the fourth surface wiring layer at the third surface and the fourth surface, respectively, and connected to the second plurality of memory cells, wherein
the first memory cell array layer and the second memory cell array layer are bonded to each other such that the second surface wiring layer and the third surface wiring layer face each other and are bonded to each other, and the first and second memory cell array regions overlap each other as viewed from a direction orthogonal to the first surface.

2. The semiconductor memory device according to claim 1, further comprising:
a peripheral circuit layer bonded to the first surface of the first memory cell array layer and electrically connected to the first plurality of memory cells.

3. The semiconductor memory device according to claim 2, wherein the peripheral circuit layer includes a silicon substrate layer.

4. The semiconductor memory device according to claim 1, further comprising:
a third memory cell array layer having a fifth surface, a sixth surface opposite the fifth surface, a third memory cell array region in which a third plurality of memory cells are 3-dimensionally arrayed, a fifth surface wiring layer at the fifth surface and connected to the third plurality of memory cells, wherein
the third memory cell array layer is bonded to second memory cell array layer such that the fifth surface wiring layer is bonded to a fourth surface wiring layer at the fourth surface of the second memory cell array layer.

5. The semiconductor memory device according to claim 1, wherein the second and third surface wiring layers are disposed outside the first and second memory cell array regions as viewed from the direction orthogonal to the first surface.

6. The semiconductor memory device according to claim 1, wherein at least a portion of the second surface wiring layer and a portion of the third surface wiring layer are disposed inside the first and second memory cell array regions as viewed from the direction orthogonal to the first surface.

7. The semiconductor memory device according to claim 1, wherein in at least one of the first and second memory cell array layers includes a memory string that includes a memory cell storing an array layer ID and a transistor for selecting memory cell array layers according to the array layer ID.

8. A semiconductor memory device, comprising:
a peripheral circuit layer that includes a circuit substrate, a control circuit formed on a circuit formation surface of the circuit substrate, and a circuit-side wiring layer formed at the circuit formation surface and electrically connected to the control circuit;
a first memory cell array layer having a first surface, a second surface opposite to the first surface, a first memory cell array region in which a first plurality of memory cells is 3-dimensionally arrayed, a first signal line extraction electrode electrically connected to the first plurality of memory cells, a first external connection electrode disposed outside the first memory cell array region, as viewed in a direction orthogonal to the first surface, and electrically connected to the control circuit, a first surface wiring layer at the first surface and connected to the first signal line extraction electrode, and a second surface wiring layer at the second surface and connected to the first external connection electrode; and
a second memory cell array layer having a third surface, a fourth surface opposite to the third surface, a second memory cell array region in which a second plurality of memory cells is 3-dimensionally arrayed, a second signal line extraction electrode electrically connected to the second plurality of memory cells, a second external connection electrode disposed outside the second memory cell array region, as viewed in the direction orthogonal to the first surface, and electrically connected to the first external connection electrode, a third surface wiring layer at the third surface and connected to the second signal line extraction electrode, and a fourth surface wiring layer at the fourth surface and connected to the second external connection electrode, wherein, the first surface faces the peripheral circuit layer, the circuit-side wiring layer and the first surface wiring layer are bonded to each other, the third surface faces the first memory cell array layer, and the second surface wiring layer and the third surface wiring layer are bonded to each other.

9. The semiconductor memory device according to claim 8, wherein neither of the first or second memory cell array layers include a substrate.

10. The semiconductor memory device according to claim 8, wherein the circuit-side wiring layer and the first surface wiring layer are directly bonded to each other, and the second surface wiring layer and the third surface wiring layer are directly bonded to each other.

11. The semiconductor memory device according to claim 8, wherein the first plurality of memory cells comprises:

a first stacked body in which a plurality of insulating layers and a plurality of electrode layers are alternately stacked, first columnar portions extending in a stacking direction in the first stacked body, a first bit line electrically connected to the first columnar portions on a side of the first surface, a first source line electrically connected to the first columnar portions on a side of the second surface, and a first source-side wiring layer disposed closer to the second surface than the first source line.

12. The semiconductor memory device according to claim 11, wherein the second plurality of memory cells comprises:

a second stacked body in which a plurality of insulating layers and a plurality of electrode layers are alternately stacked, second columnar portions extending in a stacking direction in the second stacked body, a second bit line electrically connected to the second columnar portions on a side of the third surface, a second source line electrically connected to the second columnar portions on a side of the fourth surface, and a second source-side wiring layer disposed closer to the fourth surface than the second source line.

13. The semiconductor memory device according to claim 12, wherein the first source-side wiring layer is connected to the second bit line at a position inside the first and second memory cell array regions when viewed in the direction orthogonal to the first surface.

14. The semiconductor memory device according to claim 8, wherein the second plurality of memory cells comprises:

a stacked body in which a plurality of insulating layers and a plurality of electrode layers are alternately stacked, columnar portions extending in a stacking direction in the stacked body, a bit line electrically connected to the columnar portions on a side of the third surface, a source line electrically connected to the columnar portions on a side of the fourth surface, and a source-side wiring layer disposed closer to the fourth surface than the second source line.

15. The semiconductor memory device according to claim 8, wherein the second surface wiring layer is connected to the first signal line extraction electrode at a position inside the first memory cell array region, when viewed in the direction orthogonal to the first surface, and the third surface wiring layer is connected to the second signal line extraction electrode at a position inside the second memory cell array region, when viewed in the direction orthogonal to the first surface.

16. The semiconductor memory device according to claim 8, further comprising:

a third memory cell array layer stacked on the second memory cell array layer.

17. The semiconductor memory device according to claim 8, further comprising:

a memory string in the first memory cell array layer, the memory string including a memory cell storing an array layer ID and a transistor for selecting the first memory cell array layer, the memory string being electrically connected to the first signal line extraction electrode.

18. The semiconductor memory device according to claim 8, wherein at least one of the first and second memory cell array layers includes a memory string that includes a memory cell storing an array layer ID and a transistor for selecting memory cell array layers according to the array layer ID.

19. The semiconductor memory device according to claim 8, further comprising:

an array layer select circuit configured to select a memory cell array layer according to an array layer ID, wherein wherein a part of the array layer select circuit is formed for each memory block of the first memory cell array layer.

20. The semiconductor memory device according to claim 8, wherein the circuit substrate is a silicon substrate.

* * * * *